United States Patent [19]

Itozaki et al.

[11] Patent Number: 5,447,908
[45] Date of Patent: Sep. 5, 1995

[54] SUPERCONDUCTING THIN FILM AND A METHOD FOR PREPARING THE SAME

[75] Inventors: Hideo Itozaki; Saburo Tanaka; Nobuhiko Fujita; Shuji Yazu; Tetsuji Jodai, all of Hyogo, Japan

[73] Assignee: Sumitomo Electric Industries, Ltd., Osaka, Japan

[21] Appl. No.: 291,042

[22] Filed: Aug. 15, 1994

Related U.S. Application Data

[63] Continuation of Ser. No. 764,961, Sep. 25, 1991, abandoned, which is a continuation of Ser. No. 480,364, Feb. 15, 1990, abandoned, which is a continuation of Ser. No. 220,241, Jul. 18, 1988, abandoned.

[30] Foreign Application Priority Data

Jul. 17, 1987 [JP] Japan ............................. 62-178601
Sep. 16, 1987 [JP] Japan ............................. 62-231274

[51] Int. Cl.$^6$ ............................................. B32B 9/00
[52] U.S. Cl. ................................. 505/239; 505/701; 505/702; 505/237; 505/238; 428/688; 428/689; 428/930
[58] Field of Search ............... 505/239, 701, 702, 723, 505/729, 704, 238, 230, 231, 232; 428/688, 689, 701, 702, 930

[56] References Cited

U.S. PATENT DOCUMENTS

| | | |
|---|---|---|
| 3,932,315 | 1/1976 | Sleight |
| 4,692,385 | 9/1987 | Johnson ............................. 428/698 |
| 4,753,856 | 6/1988 | Haluska et al. ................... 428/698 |
| 4,826,808 | 5/1989 | Yurek et al. ...................... 505/1 |
| 4,956,335 | 9/1990 | Agteiolla et al. ................ 428/930 |
| 4,965,247 | 10/1990 | Nishiguchi ....................... 505/701 |
| 4,970,197 | 11/1990 | Shiato et al. .................... 505/1 |
| 4,996,185 | 2/1991 | Fujimori .......................... 505/729 |
| 5,266,815 | 11/1993 | Sunami ............................. 257/30 |

FOREIGN PATENT DOCUMENTS

| | | |
|---|---|---|
| 9003265 | 4/1990 | European Pat. Off. |
| 60-173885 | 9/1989 | Japan |
| 8900343 | 1/1989 | WIPO |

OTHER PUBLICATIONS

Koinuma et al., Jap. Journ. of Appl. Phys., vol. 26, No. 5, May 1987, pp. L763–L765.
CRC, 64th Ed, Weast Ed., CRC Press, periodic table.
Geballe, "Paths to High Temp. Superconductors", Mar. 12, 1993, Science, vol. 259, pp. 1550–1551.
Superconductivity Flash Report, vol. 1, No. 14 & vol. 1, No. 13, Mar. 1988.
"Theoretical Resistance, What makes some ceramics superconductive", Scientific American, Dec. 1992, pp. 24–25.
Doss, "Engineer's Guide to High T. Superconductivity", Wiley & Sons, 1989, pp. 104–109.
"Superconductors' Material Problems", Science, vol. 240, pp. 25–27, Apr. 1, 1988.
Elliott, "Integrated Circuit Fabrication Technology", McGraw Hill, 1982, pp. 20–23.
Sahu et al., "Overview of High–T Superconductivity", in Chemistry of High T Superconductors II, ACS, 1988, pp. 4–9.
"Superconductors' Material Problems", Science, vol. 240, pp. 25–27.
Microelectronics Manufacturing to Testing, 1985 Desk Manual "Crystal's 6 Ingots".
High Tc Superconductors–compositive wire fabrication, Jin et al., Appl. Phys. Letts. 51(3) 20 Jul. 1987, pp. 203–204.

(List continued on next page.)

*Primary Examiner*—Patrick J. Ryan
*Assistant Examiner*—Patrick Jewik
*Attorney, Agent, or Firm*—Kerkam, Stowell, Kondracki & Clarke; Dennis P. Clarke

[57] ABSTRACT

An outer surface of a superconducting thin film of compound oxide such as $YBa_2Cu_3O_{7-\delta}$ deposited on a substrate such as MgO and $SrTiO_3$ is protected with a protective layer which is composed of amorphous inorganic material such as inorganic glass, amorphous oxide.

2 Claims, 1 Drawing Sheet

OTHER PUBLICATIONS

Fabrication of Dense $Ba_2YCu_3O_{7-\delta}$ SC wire by molten oxide processing, Jin. et al., Appl. Phys. Lett., 51(12), Sep. 21, 1987, pp. 943–945.

*Applied Physics Letters,* vol. 51, No. 2, pp. 139–141, Clark et al., "Effects of radiation damage in ion-implanted thin films of metal-oxide superconductors" (Jul. 13, 1987).

*Patent Abstracts of Japan,* vol. 7, No. 200 (E-196)[1345] (Sep. 3, 1983) & JP-A-58 97 880.

Bednorz and Muller, "Possible High $T_c$ Superconductivity in the Ba-La-Cu-O System", *Z. Phys. B-Condensed Matter* 64, pp. 189–193 (1986).

SUPERCONDUCTING THIN FILM AND A METHOD FOR PREPARING THE SAME

This application is a continuation of application Ser. No. 07/764,961 filed Sep. 25, 1991, now abandoned which is a continuation of application Ser. No. 07/480,364 filed Feb. 15, 1990 (now abandoned), Ser. No. 07/220,241 filed Jul. 18, 1988 (now abandoned).

BACKGROUND OF THE INVENTION

1. Field of the invention

The present invention relates to a superconducting thin film and a method for preparing the same. More particularly, it relates to a superconducting thin film of compound oxide having a high critical temperature and also possessing lasting stability for a long period and a method for preparing the same.

2. Description of the related an

The superconductivity is a phenomenon which is explained to be a phenomenon of a kind of phase change of electrons under which the electrical resistance become zero and the perfect diamagnetism is observed. Thus, under the superconducting condition, electric current of a very high current density can be delivered without any loss of power.

Therefore, if the superconducting power cable is realized, the power loss of the order of 7% which is inevitable in the conventional power cables can be reduced greatly. Realization of superconducting coils for generating a very high magnetic field is expected to accelerate development in the field of fusion power generation in which the electric power is consumed beyond its output under the present technology, as well as in the field of MHD power generation or motor-generators. The development of superconductivity are demanded also in the other industrial fields such as in the field or electric power reservation; in the field of transportation for example magnetic levitation trains, or magnetically propelling ships; in the medical field such as high-energy beam radiation unit; or in the field of science such as NMR or high-energy physics.

In addition to the abovementioned power electric applications, the superconducting materials can be used in the field of electronics, for example, as a device using the Josephson effect in which quantum efficiency is observed macroscopically when an electric current is passed through a weak junction arranged between two superconductors. Tunnel junction type Josephson device which is a typical application of the Josephson effect is expected to be a high-speed and low-power consuming switching device owing to smaller energy gap of the superconducting material. It is also expected to utilize the Josephson device as a high sensitive sensors or detectors for sensing very weak magnetic field, microwave, radiant ray or the like since variation of electromagnetic wave or magnetic field is reflected in variation of Josephson effect and can be observed as a quantum phenomenon precisely. Development of the superconducting devices is also demanded in the field of high-speed computers in which the power consumption per unit area is reaching to the upper limit of the cooling capacity with increment of the integration density in order to reduce energy consumption.

However, the critical temperature could not exceed 23.2 K of $Nb_3Ge$ which was the the highest Tc for all studies for the past in years.

Possibility of existence of a new type of superconducting materials having much higher Tc was revealed by Bednorz and Muller who discovered a new oxide type superconductor in 1986 [Z. Phys. B64 (1986) 1891].

It had been known that certain ceramics material of compound oxides exhibit the property of superconductivity. For example, U.S. Pat. No. 3,932,315 discloses Ba—Pb—Bi type compound oxide which shows superconductivity and Japanese patent laid-open No. 60-173,885 discloses that Ba—Bi type compound oxides also show superconductivity. These superconductors, however, possess rather lower transition temperatures of about 10 K. and hence usage of liquidized helium (boiling point of 4.2 K.) as cryogen is indispensable to realize superconductivity.

The new type compound oxide superconductor discovered by Bednorz and Muller is represented by [La, $Sr]_2CuO_4$ which is called as the $K_2NiF_4$-type oxide having a crystal structure which is similar to known perovskite type oxides. The $K_2NiF_4$-type oxides show such higher Tc as 30 K. which are extremely higher than known superconducting materials.

It was also reported in the news parer that C. W. Chu et al discovered in the United States of America another superconducting material so called YBCO type represented by $YBa_2Cu_3O_{7-x}$ having the critical temperature of in the order of 90 K. in February 1987. Still another type new superconducting material is a compound oxide of Bi—Sr—Ca—Cu—O system and Tl—Ba—Ca—Cu—O system which exhibit such high Tc as more than 100 K. and which are chemically much stable than the abovementioned YBCO type compound oxide or the like.

And hence, possibility of existence of high-temperature superconductors have burst on the scene.

The new type superconductor of compound oxide, however, is not stable and hence their superconductivity is lost or deteriorated with the passing of time. In fact, there is such a tendency that their critical temperature and critical current density drop gradually with the passing of time. This tendency is noticeable in case of a thin film prepaid by physical vapour deposition technique. This fact is explained by defectiveness of oxygen deficiency, in other words, imperfect oxygen contents in the crystal. It is known that its superconducting property is influenced by the oxygen contents or oxygen deficiency in the crystalline structure. In order to overcome such drawback, it is a usual practice that the deposited thin film prepared by the physical vapour deposition technique is heat-treated or annealed, particularly in the final stage of preparation, under a higher partial pressure of oxygen gas. In fact, if the deposited thin film is not heat-treated, its superconducting property is very poor.

However, even if the deposited thin film is heat-treated, it is impossible to prevent the thin film from deterioration of superconducting property which occur with the passing of time. Such deterioration may be caused by the abovementioned defectiveness of oxygen deficiency resulting from that the compound oxide react with water in air and that oxygen in the crystal escape with the passing of time or so on, so that quasi-stable phase of the superconducting compound oxide is transformed to a non-superconducting phase. The deterioration of superconductivity, in other words a phenomenon that the superconducting property is lost gradually in time is a big problem of compound oxide type superconductors in their actual use.

Therefore, an object of the present invention is to overcome the abovementioned problems of the conventional technique and to provide a superconducting thin film improved in stability during storage or during actual use and a method for preparing the same.

SUMMARY OF THE INVENTION

A superconducting thin film composed of compound oxide and deposited on a substrate according to the present invention is characterized in that an outer surface of the superconducting thin film is covered with a protective layer which is composed of amorphous inorganic material.

The amorphous inorganic material is preferably selected from a group comprising amorphous silicon compounds, amorphous nitrides, amorphous carbonates and amorphous oxides. Particularly, the amorphous inorganic material may be at least one of amorphous materials selected from a group comprising amorphous silicon, amorphous silicon nitride, amorphous silicon carbide, amorphous aluminum nitride, amorphous titanium nitride, amorphous boron nitride, amorphous titanium carbide, amorphous aluminum oxide, amorphous silicon oxide, amorphous yttrium oxide, amorphous zirconium oxide. amorphous copper oxide, amorphous lanthanum oxide, amorphous strontium oxide, amorphous titanium oxide, amorphous titanium strontium oxide, amorphous zinc oxide and amorphous magnesium oxide.

The abovementioned amorphous inorganic materials can produce a hard and high density protective layer. Since they are chemically stable and can be deposited on the superconducting thin film layer at a lower temperature such as room temperature, they do not exert a bad influence upon the superconducting thin film so that they can advantageously maintain the superconducting property of the thin film. Since the amorphous inorganic material have not special crystalline structure, the protective layer can be deposited uniformly and the preparation of such amorphous protective layer is relatively easier than that of crystalline protective layer.

According to a preferred embodiment, the amorphous inorganic material is inorganic glass, more preferably, phosphorous-silicate glass or low-melting point glass. The protective layer of inorganic glass has a very high density and is chemically stable so that it can suppress liberation of oxygen from the crystalline superconducting thin film and prevent a reaction between the oxygen in the superconducting compound oxide and water in air.

The protective layer of amorphous inorganic material can be prepared by the conventional physical vapour deposition (PVD) technique, such as vacuum deposition, sputtering, ion plating or the like or chemical vapour deposition (CVD) technique such as plasma CVD or photo CVD or the like.

Selection of the abovementioned protective layers depend on type or system of the compound oxide used.

The superconducting thin film can be composed of compound oxide of an element $\alpha$ selected from IIa group of the Periodic Table, an element $\beta$ selected from the group of the Periodic Table, at least one element $\gamma$ selected from a group comprising Ib, IIb, IIIb, IVa and VIIIa group of the Periodic Table and oxygen. The element $\gamma$ is copper in general.

Particularly, the superconducting thin film is preferably a compound oxide represented by the general formula:

$$(\alpha_{1-x}\beta_x)Cu_yO_z$$

in which $\alpha$ and $\beta$ means the same definition as above, x is an atomic ratio of $\beta$ with respect to $(\alpha+\beta)$ and has a range of $0.1 \leq x \leq 0.9$, and y and z are respective atomic ratios with respect to $(\alpha_{1-x}\beta_x)$ which is considered to be equal to 1 and each satisfy ranges of $0.4 \leq y \leq 3.0$ and $1 \leq z \leq 5$ respectively.

According to a preferred embodiment of the present invention, the element $\alpha$ is Ba or Sr and the element $\beta$ is at least one element selected from a group comprising Y, La, Gd, Dy, Ho, Er, Tm, Yb, Nd, Sm, Eu and Lu. From 10 to 80% of the element c may be substituted by one or more than one of other elements selected from IIa group of the Periodic Table. The element $\beta$ may be a combination of more than two other elements selected from IIIa group of the Periodic. A portion of these components may b substituted if necessary by at least one of elements selected from a group comprising Al, Fe, Co, Ni, Zn, Ag and Ti.

An atomic ratio of $\alpha$ to $\beta$ depends on the type or system of the compound oxide or on the combination of $\alpha$ and $\beta$. Following atomic ratios are preferably used in case of Ba—Y system, Ba—La system and Sr—La system respectively:

| | |
|---|---|
| Y/(Y + Ba) | 0.06 to 0.949 more preferably 0.1 to 0.4 |
| Ba/(La + Ba) | 0.04 to 0.96, more preferably 0.08 to 0.45 |
| Sr/(La + Sr) | 0.03 to 0.95 more preferably 0.05 to 0.1 |

Thus, the preferable compound oxides are Y—Ba—Cu—O system, La—Ba—Cu—O system and La—Sr—Cu—O system including the following special Cases:

$Y_1Ba_2Cu_3O_{7-x}$, $Ho_1Ba_2Cu_3O_{7-x}$, $Lu_1Ba_2Cu_3O_{7-x}$, $Sm_1Ba_2Cu_3O_{7-x}$, $Nd_1Ba_2Cu_3O_{7-x}$, $Gd_1Ba_2Cu_3O_{7-x}$, $Eu_1Ba_2Cu_3O_{7-x}$, $Er_1Ba_2Cu_3O_{7-x}$, $Dy_1Ba_2Cu_3O_{7-x}$, $Tm_1Ba_2Cu_3O_{7-x}$, $Yb_1Ba_2Cu_3O_{7-x}$, $La_1Ba_2Cu_3O_{7-x}$, $(La, Sr)_2CuO_{4-x}$ in which x is a number which satisfies a range of $0 < x < 1$.

The abovementioned compound oxides possess preferably perovskite type or quasi-perovskite type crystal structure. The term of quasi-perovskite type means a structure which can be considered to have such a crystal structure that is similar to Perovskite-type oxides and includes an orthorhombically distorted perovskite or a distorted oxygendeficient perovskite or the like.

The superconducting thin film may be also another type of superconductor consisting mainly of a compound oxide represented by the formula:

$$\Theta_4(\Phi_{1-q}Ca_q)_mCu_nO_{p+r}$$

in which $\Theta$ stands for Bi or Tl, $\Phi$ stands for Sr when $\Theta$ is Bi and stands for Ba when $\Theta$ is Tl, m and n are numbers each satisfying ranges of $6 \leq m \leq 10$ and $4 \leq n \leq 8$ respectively, $p = (6+m+n)$, q is a number which satisfies a range of $0 < q < 1$, and r is a number which satisfies a range of $-2 \leq r \leq +2$. This system is considered to be a single phase of the following compound oxide or a mixed phase consisting mainly thereof:

$Bi_4Sr_4Ca_4Cu_6O_{20-r}$, $Bi_2Sr_2Ca_2Cu_3O_{10-r}$, $Tl_4Ba_4Ca_4Cu_6O_{20-r}$, $Tl_2Ba_2Ca_2Cu_3O_{10-r}$, in which r is a number which satisfies a range of $-2 \leq r \leq +2$.

The substrate may be made of glass, quartz, silicon, sapphire, stainless steel or other ceramics. Particularly, the substrate consists preferably of a single crystal of MgO or SrTiO$_3$. Desirably, the superconducting thin film is deposited on a (001) plane or (110) plane of a single crystal of MgO or SrTiO$_3$.

The present invention relates also to a method for preparing a superconducting thin film on a substrate. The method is characterized in that an outer surface of the superconducting thin film is covered with a protective layer which is composed of amorphous inorganic material.

The thin film of superconductor and the protective layer can be prepared by the conventional physical vapour deposition technique, such as sputtering, vacuum deposition, ion plating, molecular beam epitaxial growth or the like. It is also possible to use chemical deposition technique (CVD) such as plasma CVD or photo CVD. Generally, the thin film of compound oxide is prepared by sputtering technique.

According to the present invention, more than two protective layers may be formed successively on the superconducting thin film layer. Each protective layer may be different in type and composition from adjacent layers.

According to a preferred embodiment of the present invention, the superconducting thin film is deposited on a substrate by sputtering technique and then a protective layer is deposited on a surface of the superconducting thin film in a common sputtering unit. Namely, the sputtering is preferably carded out by such a manner that, at first, both targets for the superconducting thin film and for the protective layer are set on respective target holders in a chamber, and then the target for the superconducting thin film is sputtered with argon gas or the like while the target for the protective layer is not sputtered. After a superconducting thin film is deposited on a substrate, the target for the protective layer is sputtered to deposit a protective layer on the superconducting thin film.

Such superconducting thin film can be prepared by sputtering technique described in our co-pending United States of America patent Ser. No. 152,714 filed on May 2, 1988.

In case of PVD, a vapour source may be elements of $\alpha$, $\beta$ and $\gamma$ themselves, oxides or carbonates thereof. An atomic ratio of these elements in the vapour source is adjusted in function of evaporation rates of these elements on the basis of an atom ratio of these elements in the thin film to be produced. For example, the atomic ration of the elements $\alpha$, $\beta$ and $\gamma$ in the vapor source is preferably selected from following range for typical compound oxide systems:

| | |
|---|---|
| Y/(Y + Ba) | 0.06 to 0.94, more preferably 0.1 to 0.4 |
| Ba/(La + Ba) | 0.04 to 0.96, more preferably 0.08 to 0.45 |
| Sr/(La + Sr) | 0.03 to 0.95, more preferably 0.05 to 0.1 |

The vapour source may be a sintered mass or a powder which is prepared by pulverizing the sintered mass which is prepared by sintering a powder mixture of Y$_2$O$_3$, CuO and BaCuO$_2$ and which may have a crystal structure of perovskite or quasi-perovskite type, For example, the sintering can be Carried out at a temperature selected in the following range:

| | |
|---|---|
| Y/(Y + Ba) | 220 to 1,230° C. |
| Ba/(La + Ba) | 234 to 1,260° C. |

The vapour source may be divided into more than two segments, for example two segments consisting of a copper target and a target composed of Ba-Y compound oxide, three targets consisting of Cu, Y and Ba, The superconducting property can be improved by heat-treatment which is effected after the thin film of compound oxide is deposited on the substrate in oxygen containing atmosphere, The heat-treatment is preferably effected under a partial pressure of oxygen ranging from 0.1 to 150 atm at a temperature between 300 and 1,500° C. After this temperature is maintained for more than one hour, the resulting thin film is cooled slowly at a rate of less than 100° C./min, preferably at a rate of less than 10° C./min. Advantage of the heat-treatment can not be obtained if the heat-treatment is effected outside the abovementioned conditions. For example, if the thin film is heated at a temperature which is higher than 1,500° C., the abovementioned advantage can not be obtained but the superconductivity will be disappeared.

In case of the compound oxide type superconductor, oxygen deficiency in its crystal is a critical factor for realizing the superconductivity, so that the heat-treatment under a relatively higher partial pressure of oxygen is very preferable and is considered to be indispensable to realize superior superconductivity.

However, it is impossible to prevent the thin film of compound oxide from deterioration which occur during storage even if the thin film is heat-treated completely. The deterioration of superconductivity, in other words a phenomenon that the superconducting property is lost gradually in time may be caused by disappearance or liberation of oxygen in the crystal because the superconductivity of compound oxide is observed in unstable or quasi-stable phase. This is a big problem of compound oxide type superconductors in their actual use.

This problem is solved by the present invention in which an outer surface of the thin film of superconductor is covered by a stable and hard protective layer of chemically stable amorphous inorganic material which can be prepared at a relatively low temperature and which has a high density to prevent oxygen from escaping from its crystal structure.

In a stage of deposition of the protective layer of amorphous inorganic material, particularly of inorganic glass onto the superconducting thin film, the substrate on which the thin film is deposited should not be heated at a temperature which is higher than 500° C. Usually, the substrate is not heated when the protective layer is deposited.

The thin film of compound oxide is preferably deposited on a (001) plane or (110) plane of a single crystal of MgO or SrTiO$_3$, or that the c-axis is orientated to a predetermined direction to improve the critical current density (Jc).

It is apparent from the description abovementioned that the superconducting thin film of compound oxide according to the present invention have improved stability than conventional superconducting thin film and hence they can be utilized advantageously in applications of thin film devices, such as Matisoo switching elements or Josephson device, Anacker memory device or Superconducting Quantum Interference Device (SQUID).

Now, the present invention will be described with reference to attached drawings which illustrate an apparatus used for carrying out the present invention. But, the present invention is not limited thereto.

BRIEF DESCRIPTION OF THE DRAWING

Referring to FIG. 1 illustrating a magnetron sputtering unit which is used in the present invention, the sputtering unit includes, in a chamber 1, two target holders for a target 2 for a superconducting thin film and a target 3 for a protective layer, a pair of magnetron electrodes 4 each surrounding respective targets 2 and 3, high-frequency power sources 5 for actuating the magnetron electrodes 4 and a substrate holder on which a substrate is secured. The chamber 1 has an exhaust port 8 which is connected to a vacuum source (not shown) and a gas inlet port 7 for introducing an atmosphere gas. The substrate holder is provided with a heater 9 for controlling a temperature of the substrate 6. Such sputtering unit itself are known and used in a variety of applications.

Figure 1:
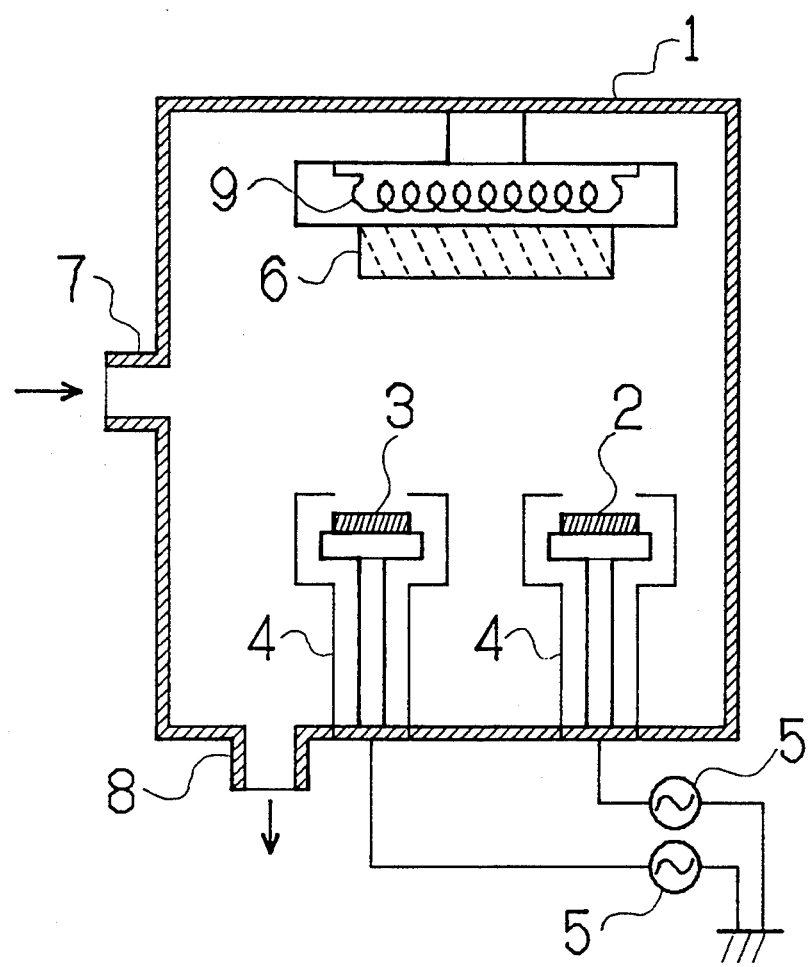
FIG. 1 is an illustrative view of a magnetron sputtering unit which is used in the present invention.

In operation, after a substrate 6 is secured to the substrate holder and targets 2 and 3 are set on respective target holder in the chamber 1, vacuum is created in the chamber 1 and a suitable gas such as argon and/or oxygen at a predetermined pressure is introduced into the chamber 1. After the substrate 6 is heated to a predetermined temperature by the heater 9, high-frequency power is applied to one of the magnetron electrode 4 surrounding the target 2 for the superconducting thin film to start sputtering operation. Introduction of the atmosphere gas in the chamber 1 is controlled at a predetermined pressure during the sputtering operation. The deposition of the superconducting thin film of compound oxide is carried out by the conventional sputtering technique.

After the thin film of compound oxide is deposited, another the magnetron electrode 4 surrounding the target 3 for the protective layer is energized so that a thin film of the protective layer is deposited on the superconducting thin film.

Now, several embodiments of the method according to the present invention will be described by Examples, but the scope of the present invention should not be limited thereto.

In the following Examples, both of the superconducting thin film and the protective layer are prepared in the sputtering unit shown in FIG. 1. For comparison, two series of samples are prepared in such manner that the first series possesses the protective layer while second series do not possess the same.

Example 1

Powders of $Y_2O_3$ and $BaCO_3$ were mixed in an atomic ratio of Y: Ba=1:2. Then, a powder of CuO was added to the resulting powder mixture in a proportion which is 10% excess with respect to an atomic ratio of Y:Ba:Cu=1:2:3. The resulting powder mixture was sintered at 950° C. to obtain a sintered block of $YBa_2Cu_3O_7$ which will be used as a target 2 for a superconducting thin film.

The resulting target 2 and a target 3 composed of silicon nitride are set on respective target holder and a substrate 6 consisting of a single crystal of MgO are secured on the substrate holders. The MgO crystal is set in such manner that its surface on which the thin film is deposited has a (001) plane.

After the chamber 1 is vacuumed, argon gas with a partial pressure of $5.0 \times 10^{-2}$ Torr and oxygen gas with a partial pressure of $1.0 \times 10^{-2}$ Torr are introduced and the substrate is heated at 630° C. Then, the magnetron electrode 4 for the target 2 is energized with high frequency of 3 W/cm$^2$ to prepare a thin film of compound oxide of 1 μm on the substrate at a film forming rate of 0.50 Å/sec.

After deposition of the thin film of compound oxide complete, oxygen gas of 1 atom is introduced in the chamber 1 and the temperature of the substrate is adjusted at 650° C. The deposited thin film is left under this condition for 15 hour and then cooled slowly at a cooling rate of 7° C./min.

Then, another magnetron electrode for the protective layer 3 is energized so that silicon nitride is sputtered under a partial pressure of Ar gas of $3.0 \times 10^{-3}$ Torr to deposit a protective layer of 2,000 Å on the thin film of compound oxide which is prepared in the abovementioned step.

Resistance of the resulting thin film is measured on a sample on which aluminum electrodes are vacuum-deposited at opposite ends of the thin film of compound oxide deposited on the substrate 6.

Measurement of the critical temperature Tc and Tcf was carded out by a conventional four probe method in which the sample was immersed in liquidized helium to cool the ample down to a temperature of 8 K. in a cryostat. Then, the temperature dependence of resistance of the sample was determined with rising the temperature gradually to determine a temperature of Tcf at which the perfect superconductivity start to be lost and a resistance begin to appear and a temperature of Tc at which the superconductivity is lost and an ordinary resistance begin to appear.

Changes of Tcf and Tc are determined by comparing two values observed on same sample just after the protective layer is deposited and after one month.

The result as well as main operational parameters are shown in Table 1.

EXAMPLE 2

The same procedure as Example 1 is repeated except that a sintered block of $LaBa_2Cu_3O_7$ is used as a target for a thin film of compound oxide which is prepared by following procedure:

Powders of $La_2O_3$ and $BaCO_3$ were mixed at an atomic ratio of La:Ba=1:2 and then a powder of CuO was added to the resulting mixture in 10% excess of an atomic ratio of Y:Ba:Cu=1:2:3. Then, the resulting powder mixture was sintered at 90° C. to obtain a sintered block of $LaBa_2Cu_3O_7$ which is used is a target 2 for a superconducting thin film.

The result as well as main operational parameters are shown in Table 1.

TABLE 1

| No. | Partial pressure of $O_2$ (Torr) | Temperature of Substrate (°C.) | Protective Layer | Just after deposition | | One month later | |
|---|---|---|---|---|---|---|---|
| | | | | Tc (K) | Tcf (K) | Tc (K) | Tcf (K) |
| 1 | $1.0 \times 10^{-2}$ | 650 | SiN | 78 | 67 | 77 | 67 |
| | | | — | 77 | 68 | 12 | — |
| 2 | $7.0 \times 10^{-3}$ | 620 | SiN | 56 | 39 | 57 | 38 |
| | | | — | 57 | 40 | 1 | — |

(Note) —: Superconductivity is not observed in liquid helium

EXAMPLE 3

The same procedure as Example 1 is repeated except that the target of silicon nitride is replaced by a target of zirconium oxide and that the surrounding gas is changed to argon gas with a partial pressure of $4 \times 10^{-3}$ Torr and oxygen gas with a partial pressure of $1 \times 10^{-3}$ Torr. The result as well as main operational parameters are shown in Table 2.

EXAMPLE 4

The same procedure as Example 2 is repeated except that the target of silicon nitride is replaced by a target of zirconium oxide and that the surrounding gas is changed to argon gas with a partial pressure of $4 \times 10^{-3}$ Torr and oxygen gas with a partial pressure of $1 \times 10^{-3}$ Torr.

The result as well as main operational parameters are shown in Table 2.

the substrate is heated at 650° C. Then, the magnetron electrode 4 for the target 2 is energized with high frequency of 3 W/cm² to prepare a thin film of compound oxide of 1 μm on the substrate at a film forming rate of 0.50 Å/sec.

After deposition of the thin film of compound oxide complete, oxygen gas of 1 atm is introduced in the chamber 1 and the temperature of the substrate is adjusted at 650° C. The deposited thin film is left under this condition for 15 hour and then cooled slowly at a cooling rate of 7° C./min.

Then, another magnetron electrode for the protective layer 3 is energized so that a glass composed of $SiO_2$ containing very small amount of $P_2O_5$ is sputtered with argon gas under a pressure of $3.0 \times 10^{-3}$ Torr to deposit a protective layer of 2,000 Å on the thin film of compound oxide which is prepared in the abovementioned step.

Measurement of the critical temperature Tc and Tcf

TABLE 2

| No. | Partial pressure of $O_2$ (Torr) | Temperature of Substrate (°C.) | Protective Layer | Just after deposition | | One month later | |
|---|---|---|---|---|---|---|---|
| | | | | Tc (K) | Tcf (K) | Tc (K) | Tcf (K) |
| 3 | $8.0 \times 10^{-3}$ | 700 | $ZrO_2$ | 88 | 77 | 87 | 78 |
| | | | — | 90 | 79 | 29 | — |
| 4 | $5.0 \times 10^{-3}$ | 640 | $ZrO_2$ | 48 | 35 | 49 | 35 |
| | | | — | 47 | 36 | 3 | — |

(Note) —: Superconductivity is not observed in liquid helium

EXAMPLE 5

Powders of $Y_2O_3$ and $BaCuO_2$ which is prepared by sintering powders of $BaCO_3$ and CuO are mixed at an atomic ratio of Y:Ba:Cu=1:2:3.2 (copper is added excessively because the sputtering rate of copper is higher than the other two) and then sintered at 950° C. to obtain a sintered block of $YBa_2Cu_3O_7$ which will be used as a target 2 for a superconducting thin film. The resulting target 2 and a glass target 3 composed of $SiO_2$ containing very small amount of $P_2O_5$ are set on respective target holders and a substrate 6 consisting of a single crystal of MgO is secured on the substrate holder. The MgO crystal is set in such manner that its surface on which the thin film is deposited has a (001) plane.

After the chamber 1 is vacuumed, argon gas at a partial pressure of $5.0 \times 10^{-2}$ Torr and oxygen gas at a partial pressure of $1.0 \times 10^{-2}$ Torr are introduced and was carried out by the same method as Example 1. The result as well as main operational parameters are shown in Table 3.

EXAMPLE 6

The same procedure as Example 5 is repeated except that the glass target composed of $SiO_2$ containing very small mount of $P_2O_5$ is replaced by another glass target composed of 85% by weight of PbO, 7.5% by weight of $SiO_2$ and 7.5% by weight of $B_2O_3$ and that the atmosphere gas for the protective layer is changed to a gas mixture of argon under a partial pressure of $4 \times 10^{-3}$ Torr and oxygen gas under a partial pressure of $1 \times 10^{-3}$ Torr.

The result as well as main operational parameters are shown in Table 3.

TABLE 3

| No. | Partial pressure of $O_2$ (Torr) | Temperature of Substrate (°C.) | Protective Layer | Just after deposition | | One month later | |
|---|---|---|---|---|---|---|---|
| | | | | Tc (K) | Tcf (K) | Tc (K) | Tcf (K) |
| 5 | $1.0 \times 10^{-2}$ | 650 | glass (1) | 78 | 67 | 77 | 68 |
| | | | — | 77 | 68 | 12 | — |
| 6 | $7.0 \times 10^{-3}$ | 620 | glass (2) | 72 | 63 | 73 | 62 |
| | | | — | 74 | 65 | 11 | — |

(Note) Glass (1): Phosphorous silicate glass
Glass (2): Low-melting point glass
—: Superconductivity is not observed in liquid helium

What is claimed:

1. A superconducting thin film of compound oxide deposited on a substrate of single crystal of MgO or single crystal of SrTiO$_3$, quartz or sapphire, characterized in that said compound oxide is selected from the group consisting of oxides having the formulae:

$Y_1Ba_2Cu_3O_{7-x}$, $Ho_1Ba_2Cu_3O_{7-x}$, $Lu_1Ba_2Cu_3O_{7-x}$, $Sm_1Ba_2Cu_3O_{7-x}$, $Nd_1Ba_2Cu_3O_{7-x}$, $Gd_1Ba_2Cu_3O_{7-x}$, $Eu_1Ba_2Cu_3O_{7-x}$, $Er_1Ba_2Cu_3O_{7-x}$, $Dy_1Ba_2Cu_3O_{7-x}$, $Tm_1Ba_2Cu_3O_{7-x}$, $Yb_1Ba_2Cu_3O_{7-x}$, and $La_1Ba_2Cu_3O_{7-x}$, in which x is a number which satisfies a range of $0<x<1$, and in that an outer surface of said superconducting thin film is covered with a protective layer which is made of amorphous inorganic material selected from the group consisting of amorphous silicon nitride, amorphous silicon carbide, amorphous aluminum nitride, amorphous titanium nitride, amorphous boron nitride and amorphous titanium carbide.

2. The superconducting thin film set forth in claim 1, wherein said superconducting thin film has a crystal structure of perovskite.

* * * * *